(12) United States Patent
Myers et al.

(10) Patent No.: US 8,493,749 B2
(45) Date of Patent: Jul. 23, 2013

(54) CONFORMING EMI SHIELDING

(75) Inventors: Scott Myers, San Francisco, CA (US); Douglas Weber, Arcadia, CA (US)

(73) Assignee: Apple Inc., Cupertino, CA (US)

( * ) Notice: Subject to any disclaimer, the term of this patent is extended or adjusted under 35 U.S.C. 154(b) by 322 days.

(21) Appl. No.: 12/777,775

(22) Filed: May 11, 2010

(65) Prior Publication Data

US 2011/0085316 A1    Apr. 14, 2011

Related U.S. Application Data

(60) Provisional application No. 61/250,767, filed on Oct. 12, 2009.

(51) Int. Cl.
*H05K 9/00* (2006.01)

(52) U.S. Cl.
USPC ............................................. 361/818

(58) Field of Classification Search
USPC ................. 361/818, 704, 707, 724, 748, 752, 361/760; 174/255, 258–261, 350
See application file for complete search history.

(56) References Cited

U.S. PATENT DOCUMENTS

2005/0064626 A1* 3/2005 Light et al. .................... 438/106
2010/0319981 A1* 12/2010 Kapusta et al. ............... 174/350

* cited by examiner

*Primary Examiner* — Jeremy Norris
*Assistant Examiner* — Tremesha S Willis (57) ABSTRACT

This is directed to an EMI shield constructed from a conformal coating. A circuit board can include electronic components for which EMI shielding is required. To provide such shielding in a space-efficient manner, a first non-conductive conformal coating can be placed over the circuit board and the electronic components. A second conductive conformal coating can then be placed over the first such that at least portions of the second coating around the periphery of the electronic components are electrically coupled to the circuit board.

22 Claims, 5 Drawing Sheets

CONFORMING EMI SHIELDING

CROSS-REFERENCE TO RELATED APPLICATION

This application claims priority to previously filed U.S. Provisional Patent Application No. 61/250,767, filed Oct. 12, 2009, entitled "CONFORMING EMI SHIELDING," which is incorporated by reference herein in its entirety.

BACKGROUND

This is directed to using conformal coating to provide electromagnetic interference (EMI) shielding for components of an electronic device. In particular, this is directed to an EMI shield constructed from a conformal coating applied to a circuit board.

A portable electronic device can include several components coupled to a circuit board for providing processing and other device operations. Some of the components can generate electromagnetic waves that interfere with the operation of other components of the device. For example, circuitry associated with connecting to a communications network can interfere with other device components (e.g., sensor arrays). To protect the components from such interference, different approaches can be used. In one embodiment a conductive can shielding can be constructed around the components. For example, a frame can be soldered around the periphery of the components, and a cover can be attached to the frame.

The frame and cover approach, however, may require two distinct components, constructed from sheets of conductive material (e.g., from sheet metal) added to the circuit board supporting the electronic device components. This can in turn require additional space within the device for the EMI shield, which may place a limit on the device size.

SUMMARY OF THE INVENTION

This is directed to using a conformal coating for providing EMI shielding within an electronic device. In particular, this is directed to applying consecutive sheets of conformal coating over components of an electronic device circuit board to provide both a water-resistant coating and an EMI shield.

An electronic device can include at least one circuit board on which one or more components can be mounted. The board can be treated with a conformal coating, which provides a substantially continuous layer of material around the board and the components. The conformal coating can be constructed using any suitable non-conductive material such that contaminate is substantially prevented from leaking through the coating and shorting the electronic device components.

To provide EMI shielding to the device components, a second layer of conforming material can be applied to the circuit board. The material used for the second layer can be a conductive material, which can prevent electromagnetic waves from propagating from one component to another. The second layer can be electrically coupled to the circuit board to provide grounding. In particular, the second layer can be coupled to conductive pads of the circuit board through openings or apertures of the first (non-conductive) layer.

The electronic device can ensure that the conductive coating remains electrically coupled to the circuit board conductive pads using any suitable approach. In some embodiments, the non-conductive coating can include openings shaped in a manner to ensure that at least a minimum surface area of conductive pad remains exposed (e.g., via a criss-cross pattern). In some embodiments, the electronic device can include a mechanical engaging mechanism or other fastening component for ensuring that the conductive layer remains in contact with the contact pads.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

An electronic device can include components for which EMI shielding is required. To provide appropriate EMI shielding while limiting the amount of space required for the shield, the electronic device can include a conformal coating layer constructed from conductive material. The conductive conformal coating can be electrically coupled to one or more pads on the circuit board (e.g., around the periphery of the device components) to ensure that the conductive coating, which serves as an EMI shield, is grounded. The electronic device can include an intermediate non-conductive coating between the electronic device components and the conductive conformal coating layer to ensure that the conductive layer does not short the electronic device components. In some embodiments, the non-conductive layer can include openings in the layer to allow the conductive layer to be electrically coupled to the circuit board.

Figure 1:
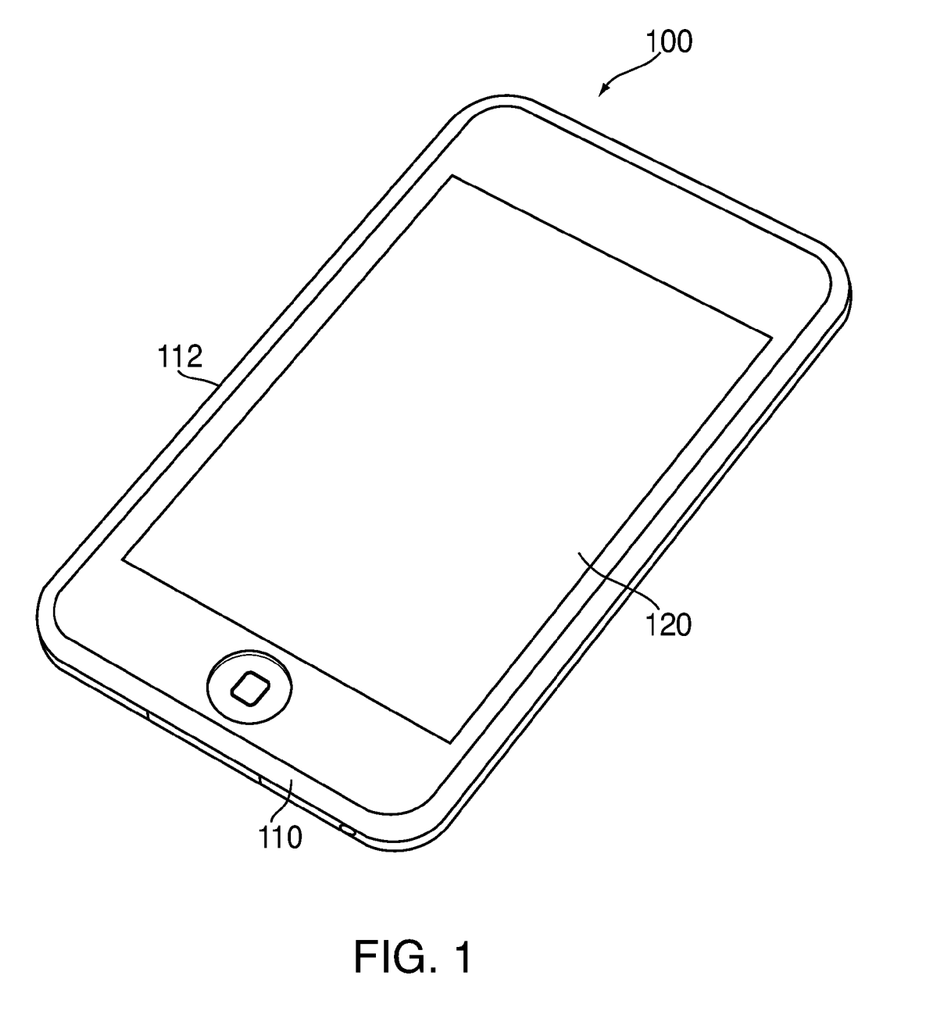
FIG. 1 is a schematic view of an illustrative electronic device in accordance with one embodiment of the invention.

FIG. 1 is a schematic view of an electronic device in accordance with one embodiment of the invention. Electronic device 100 can include housing 110, bezel 112, and window 120. Bezel 112 can be coupled to housing 110 in a manner to secure window 120 to the bezel. Housing 110 and bezel 112 can be constructed from any suitable material, including for example plastic, metal, or a composite material. In one implementation, housing 110 can be constructed from plastic or any metal such as aluminum, and bezel 112 can be constructed from any metal such as stainless steel. Window 120 can be constructed from any suitable transparent or translucent material, including for example glass or plastic. Different electronic device components can be retained within electronic device 100 to provide different functionality to the user.

In some embodiments, electronic device 100 can include components that generate electromagnetic waves that may interfere with the proper operation of other electronic device components. Those components may then need to be shielded to ensure proper operation of the electronic device.

Figure 2:
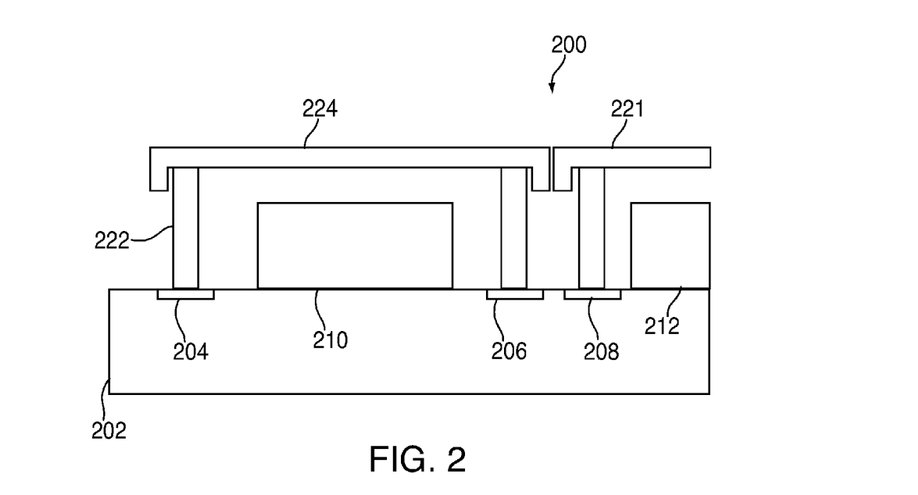
FIG. 2 is a cross-sectional view of an illustrative EMI frame and can coupled to a circuit board.

The electronic device can provide EMI shielding using any suitable approach. In some embodiments, the electronic device can include a frame extending from the surface of a circuit board over which a cover can be releasably coupled. FIG. 2 is a cross-sectional view of an illustrative EMI frame and can coupled to a circuit board. Electronic device 200 can include circuit board 202 to which components 210 and 212 are coupled. Although FIG. 2 only shows two components, it will be understood that any suitable number or type of components can be coupled to the circuit board. To protect components 210 and 212 from EMI caused by other components, conductive shields 220 and 221 can be constructed around the components. Shield 220 can include frame 222, which can include a wall placed substantially around the periphery of the component (e.g., component 210), and over which cover 224 can be placed and electrically connected (e.g., by contact if both frame 222 and cover 224 are conductive). Frame 222 can be electrically connected to the circuit board via conductive pads 204 and 206 extending at least partially around the periphery of the component (and pad 208 for shield 221). Frame 222 can be mounted using any suitable approach, including for example soldering and SMT. To completely enclose the component and prevent electromagnetic waves from leaking, cover 224 can be placed over frame 222 such that small or no gaps exist between the frame and cover. This approach, however, requires additional components within the device and thus limits the size of the device.

Figure 3:
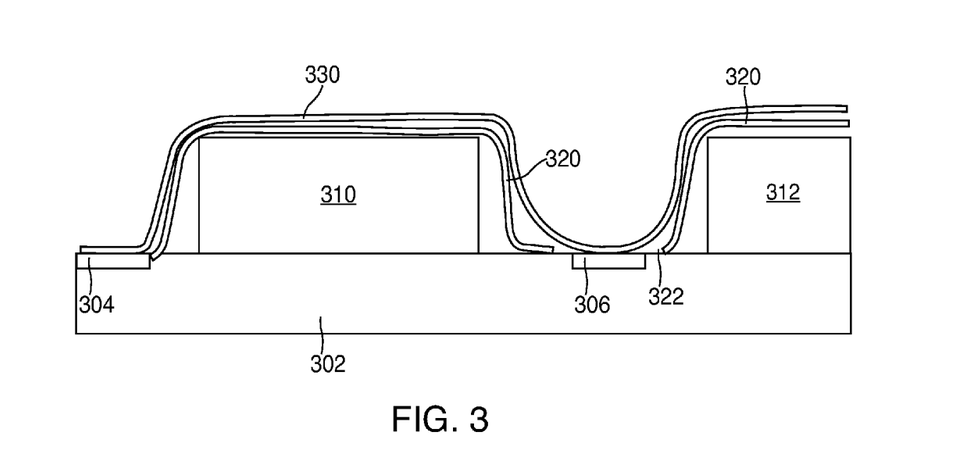
FIG. 3 is a cross-sectional view of an illustrative conforming coating EMI shield used with a circuit board in accordance with one embodiment of the invention.

In some embodiments, the electronic device can instead include a conforming coating or cover for providing EMI shielding. FIG. 3 is a cross-sectional view of an illustrative conforming coating EMI shield used with a circuit board in accordance with one embodiment of the invention. Electronic device 300 can include circuit board 302 on which electronic components 310 and 312 can be mounted. To provide waterproofing or water resistance, as well as resistance to other contaminates, to the circuit board and components (e.g., to prevent water from shorting the circuit board), conformal coating 320 can be applied to the surface of the board. Conformal coating 320 can include any suitable material, including for example a non-conductive material (e.g., a patterned acrylic sealing adhesive).

To provide EMI shielding, as well as additional contaminate resistance, a second conductive conformal coating 330 can be applied to the circuit board over the first conformal coating. Coating 330 can be constructed from any suitable conductive material (e.g., conductive sealing adhesive), including for example an aluminum sheet or other metallic layer. The coatings can be applied to the circuit board using any suitable process, including for example an adhesive (e.g., a pressure sensitive adhesive), heat process (e.g., heat shrink), sputter, physical vapor deposition (PVD), or any other process for deposing a layer of material on the circuit board. Although only two coatings are shown in the example of FIG. 3, it will be understood that any suitable number of coatings (conductive or not) can be applied to the circuit board over the components. In some embodiments, coating 320 can instead or in addition include a non-conductive material placed between the component and the circuit board to prevent undesired shorting (if required).

To ensure that coating 330 provides sufficient EMI shielding, coating 330 can be electrically coupled to contact pads 304 and 306 of circuit board 302. Coating 320 can include opening 322 through which coating 330 can extend and come into contact with pads 304 and 306. Opening 322 can have any suitable shape or size. For example, opening 322 can have a substantially rectangular shape, such that the width of the rectangle is at least a minimum width for ensuring sufficient surface area is exposed for coupling with conductive coating 330. Contact pads 304 and 306, and openings 322 in coating 320 can be distributed along circuit board 302 in any suitable configuration. In some embodiments, contact pads 304 and 306 can form a substantially continuous contact surface around the periphery of the device components (e.g., component 310). Alternatively, a particular number of contact pads (e.g., pads 304 and 306) can be distributed around the periphery of the device component. The contact pads can be distributed in any suitable pattern or distribution, including for example evenly around the periphery or with varying distances between adjacent pads. Openings 322 can similarly be distributed in any suitable configuration, including for example in a configuration substantially corresponding to the configuration of the contact pads.

Figure 4:
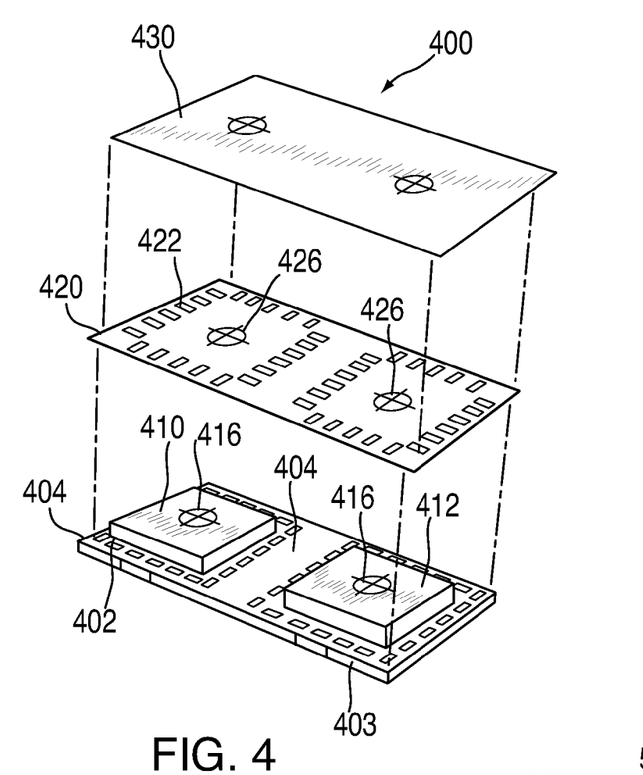
FIG. 4 is an exploded view of a conforming coating EMI shield applied to a circuit board in accordance with one embodiment of the invention.

FIG. 4 is an exploded view of a conforming coating EMI shield applied to a circuit board in accordance with one embodiment of the invention. Assembly 400 can include circuit board 402, non-conductive coating 420, and conductive EMI shielding coating 430. Circuit board 402 can include components 410 and 412 mounted on the circuit board. To ensure that conductive coating 430 is properly connected to the circuit board, thus ensuring that coating 430 is grounded and can shield components 410 and 412, circuit board 402 can include contact pads 404 positioned around the periphery of each component 410 and 412. The contact pads can form a continuous pad around the periphery of the components, or can instead or in addition for a series of discreet pads around the periphery of each component. In some embodiments, circuit board 402 can include distinct series of contact pads 404 around each component (e.g., around components 410 and 412), or circuit board 402 can instead or in addition include at least some contact pads 404 that form a shared boundary between two components (e.g., the contact pads between components 410 and 412). The particular configuration of contact pads can depend, in some cases, on the number of distinct conductive conformal coatings applied to the circuit board for EMI shielding (e.g., apply distinct coatings that do not contact each other for different sets of electronic device components). In some embodiments, contact pads 404 can be positioned along an edge 403 of circuit board 402 (e.g., to further reduce the space required for shielding device components).

Coating 420 can be formed from any non-conductive material, and include some or all of the features of coating 320 (FIG. 3). Coating 420 can include openings 422 and 424 defining a periphery. The size and placement of openings 422 and 424 can be selected such that when coating 420 is placed on circuit board 402 and coupled to the circuit board (e.g., via an adhesive or heat shrinking), each or almost each opening 422 and 424 may be placed over at least a portion of a contact pad 404. In some embodiments, one or more of openings 422 and 424 can be placed such that the openings align with a contact pad 404 placed on the edge 403 of circuit board 402. To assist in the alignment of coating 420 with the circuit board, coating 420 can include targets or fiducials 426 to align with corresponding targets or fiducials 416 of circuit board 402 (e.g., placed on the surface of components 410 and 412).

Conductive coating 430, which can provide EMI shielding for components 410 and 412, can include some or all of the features of conductive coating 330 (FIG. 3). Conductive coating 430 can be applied over coating 420 such that at least portions of coating 430 can be placed in contact with contact pads 404. In some embodiments, conductive coating 430 can provide individual EMI shielding for each component of circuit board 402 (e.g., with distinct, electrically isolated coatings), or can instead or in addition provide shielding for a subset of components. Conductive coating 430 may be prevented from coming into contact with components 410 and 412 by non-conductive coating 420, which can ensure that conductive coating 430 does not short the components.

Figure 5:
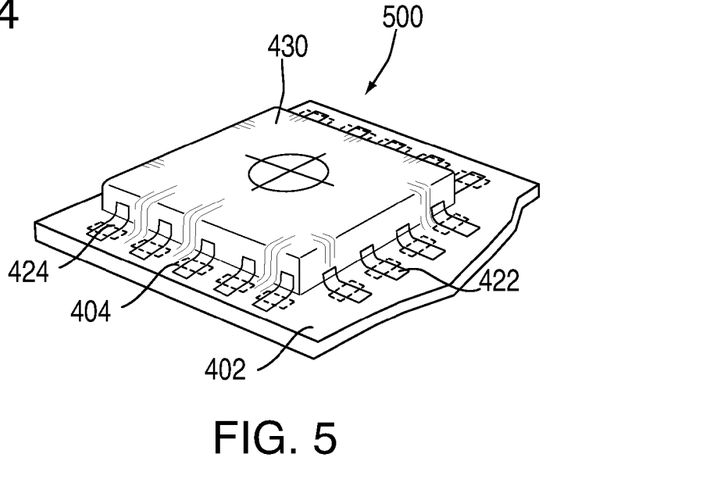
FIG. 5 is a schematic view of a portion of the assembled confirming coating EMI shield and circuit board of FIG. 4 in accordance with one embodiment of the invention.

FIG. 5 is a schematic view of a portion of the assembled confirming coating EMI shield and circuit board of FIG. 4 in accordance with one embodiment of the invention. Assembly 500 can include circuit board 402 over which a non-conductive coating (not visible) and conductive coating 430 are applied. The non-conductive coating can include openings 422 and 424 having different orientations. In particular, openings 422 and 424 can include rectangular openings oriented such that the short end of the rectangle is substantially parallel to the component periphery. Circuit board 402 can include corresponding rectangular pads 404 oriented substantially perpendicular to openings 422 and 424 (e.g., the long end of the rectangular pad is substantially parallel to the component periphery). The resulting assembly can include substantially cross-shaped or criss-crossing interfaces between the contact pads and the non-conductive coating, where only the intersection of the contact pads and the openings are exposed for conductive coating 430. This can ensure that at least a minimum surface area defined by the rectangle having the short end of each of the contact pad and opening will be exposed for conductive coating 430 to connect to the contact pads (e.g., a minimum surface for keeping coating 430 coupled to pads 404). In particular, this can provide substantial play or tolerances for aligning and assembling the non-conductive contact sheet to the circuit board while ensuring that the contact pads remain sufficiently exposed, as the application of the coating, and in particular the adhering of the coating to the circuit board, may be difficult to control precisely. Although the shapes used in FIGS. 4 and 5 for the openings and contact pads are rectangles, it will be understood that any other shape could be used, in particular any shape by which a minimum contact area can be easily provided.

In some embodiments, the combination of the non-conductive and conductive conformal coatings can provide enhanced thermal dissipation. In particular, because the coatings extend over some or all of the circuit board, heat generated by the circuit board components can be distributed and directed by the coating to dissipate evenly on all areas of the circuit board via thermal conduction. This can avoid localized peaks in heat on the board, and thus reduce the operating temperature of the device. In some embodiments, one or both of the conformal coating layers can be made of an asymmetrically thermal conductive material (e.g., graphite in the conductive layer) such that heat can be directed to a particular location on the circuit board. In particular, this approach can be used to direct heat away from heat-generating components or heat-sensitive components (e.g., away from processors or sensors), or used to direct heat to a heat sink or other component for removing heat from the device. In some embodiments, this approach can be used to direct heat to a secondary power source, or to an internal mechanism for storing usable energy from the dissipated heat.

The conductive coating must be electrically coupled to the circuit board for it to provide acceptable EMI shielding. Because the non-conductive coating is placed between the conductive coating and the circuit board, the non-conductive coating may require an opening adjacent to the contact pads of the circuit board. The opening can be created using any suitable approach. In some embodiment, the non-conductive coating can be provided with existing openings, as described above in the context of FIGS. 4 and 5. In some embodiments, the opening can be created once the non-conductive coating has been applied to the circuit board and covers the contact pads. Any suitable approach can be used to create the opening in the non-conductive coating while retaining the contaminate-resistant or waterproof seal of the coating with the circuit board. For example, a laser ablation process or other related process can be used to selectively remove portions of the non-conductive housing. The laser size and intensity can be selected to burn away only the required portions of the non-conductive coating without damaging the contact pad or damaging the interface between the coating and the circuit board.

Figure 6:
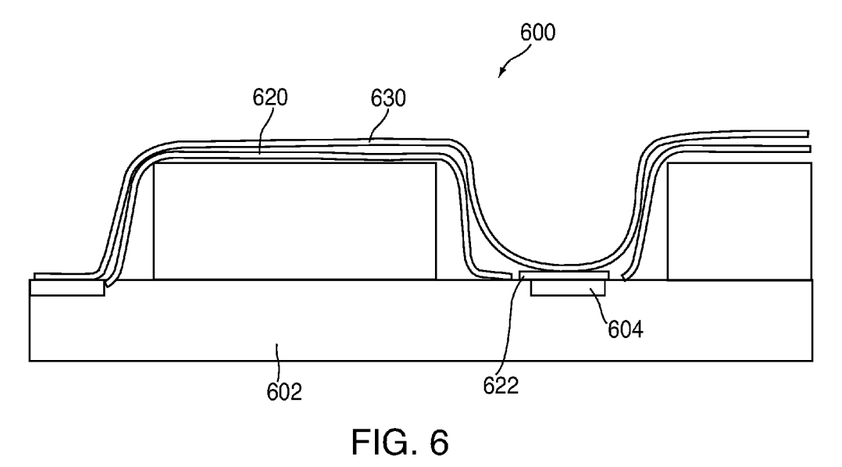
FIG. 6 is a cross-sectional view of an illustrative conforming coating EMI shield from which a portion of non-conductive coating is removed in accordance with one embodiment of the invention.

FIG. 6 is a cross-sectional view of an illustrative conforming coating EMI shield from which a portion of non-conductive coating is removed in accordance with one embodiment of the invention. Assembly 600 can include circuit board 602 over which non-conductive coating 620 and conductive coating 630 can be placed. Circuit board 602 can include conductive pad 604 to be placed in contact with conductive coating 630. To ensure that the portion of non-conductive coating 620 overlaid on contact pad 604 is removed, an intermediate coating 622 can be placed over contact pad 604 before non-conductive coating 620 is placed on circuit board 602. Intermediate coating 622 can be formed from any suitable material, including for example Teflon or polyethylene. Once the non-conductive coating has been overlaid on the circuit board and cured (if necessary), intermediate coating 622 can be removed (e.g., via laser or etching) to remove both the intermediate coating 622 and the portion of non-conductive layer 620 over contact pad 604. When conductive layer 630 is later positioned over non-conductive layer 620, conductive layer 630 can be in electrical contact with contact pad 604.

As another example, a photolithography or other related process of the type can be used. A mask can be placed over the non-conductive coating such that the mask includes a opening to align with the contact pads of the circuit board. Once the mask placed, the circuit board and mask can be etched or exposed to particular light or chemicals to remove the unmasked portions of the non-conductive coating. Although a few approaches for creating the opening in the coating were described above, it will be understood that any other suitable approach can be used instead of or in addition to those described.

Figure 7:
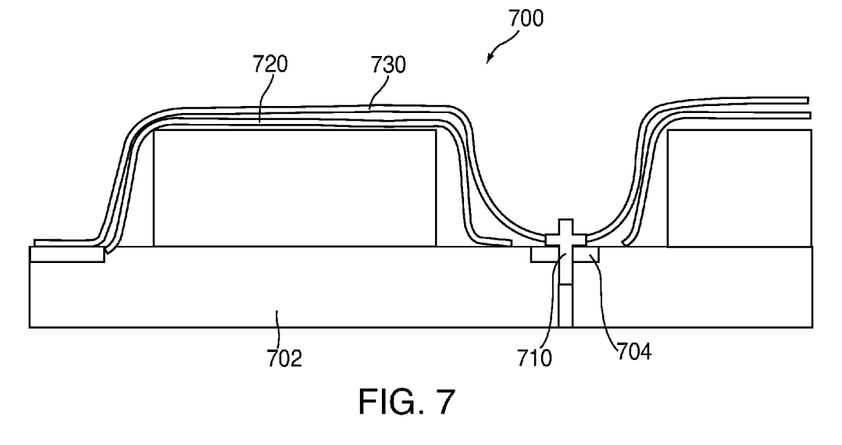
FIG. 7 is a cross-sectional view of an illustrative conforming coating EMI shield coupled to a circuit board using a mechanical fastener in accordance with one embodiment of the invention.

The conductive coating can be electrically coupled to the contact pads of the circuit board using any suitable approach. In some embodiments, the conductive coating can be secured to the contact pads using an adhesive (e.g., the adhesive of the conductive coating). Alternatively, an electrically conductive coupling can be used (e.g., SMT or soldering). As still another example, a mechanical fastener can be used. FIG. 7 is a cross-sectional view of an illustrative conforming coating EMI shield coupled to a circuit board using a mechanical fastener in accordance with one embodiment of the invention. Assembly 700 can include circuit board 702 over which non-conductive coating 720 and conductive coating 730 can be placed. Circuit board 702 can include conductive pad 704 to be placed in contact with conductive coating 730. To ensure that conductive coating remains in contact with contact pad 704, assembly 700 can include fastener 710 serving as a connection interface for retaining the conductive coating. Fastener 710 can include at least one conductive portion for providing a conductive path between the coating and pad, or alternative can include non-conductive portions securing the coating and pad together. Fastener 710 can be coupled to circuit board 702 using any suitable approach, including for example SMT, soldering, an adhesive, a snap, or a mechanical fastener.

Figure 8:
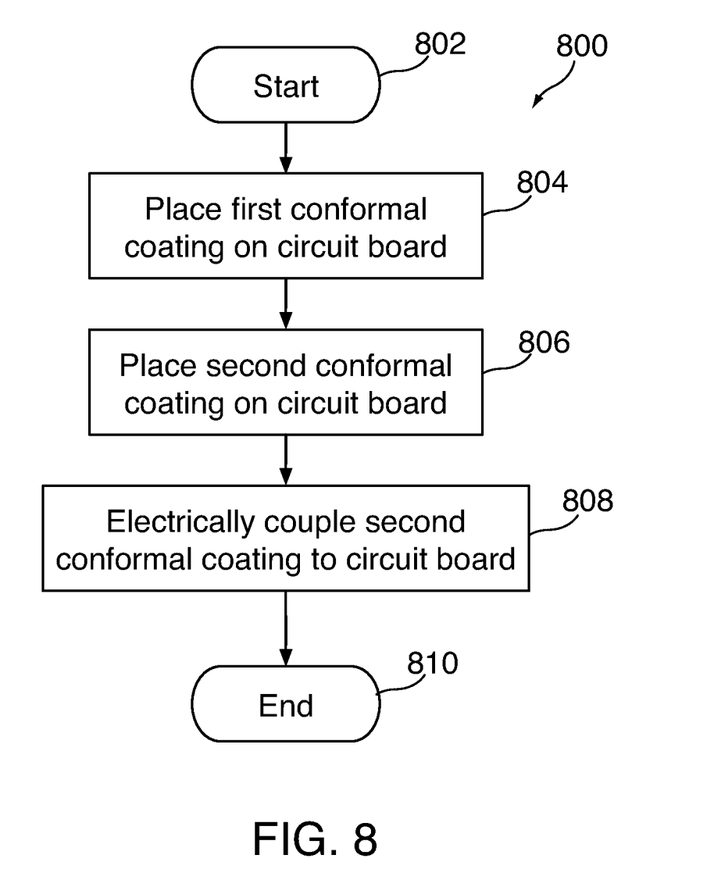
FIG. 8 is a flowchart of an illustrative process for providing a conformal coating EMI shield in accordance with one embodiment of the invention.

FIG. 8 is a flowchart of an illustrative process for providing a conformal coating EMI shield in accordance with one embodiment of the invention. Process 800 can begin at step 802. At step 804, a first conformal layer can be placed on a circuit board. The first conformal coating or layer can be secured to the circuit board to provide a substantially water resistant seal. The first conformal coating can be constructed from a non-conductive material to ensure that components coupled to the circuit board are not shorted. At step 806, a second conformal coating or layer can be secured to the circuit board over the first coating. The second coating can be constructed from a conductive material to serve as an EMI shield. In some embodiments, an additional step can occur between steps 804 and 806 to expose contact pads to be electrically coupled to the second coating. For example, a mask can be removed, or another process for selectively removing the first coating can occur. At step 808, the second conformal coating can be electrically coupled to the circuit board through the first coating. For example, one or more openings (e.g., around the periphery of one or more components) can be created in the first conformal coating (e.g., using a laser or etching) through which the second coating can contact the circuit board (e.g., contact pads of the circuit board). As another example, the first coating can be generated with existing openings that are aligned with corresponding contact pads of the circuit board. In some embodiments, step 808 can be skipped (e.g., when the contact pads are previously exposed prior to applying the second conformal coating). Process 800 can then end at step 810.

The previously described embodiments are presented for purposes of illustration and not of limitation. It is understood that one or more features of an embodiment can be combined with one or more features of another embodiment to provide systems and/or methods without deviating from the spirit and scope of the invention. The present invention is limited only by the claims which follow.

What is claimed is:

1. An electronic device, comprising:
a circuit board comprising a plurality of contact pads;
at least one component coupled to the circuit board requiring EMI shielding, wherein the plurality of contact pads are positioned around a periphery of the at least one component;
a first preformed non-conductive conformal sheet placed over the circuit board and the at least one component, the first preformed non-conductive conformal sheet comprising a plurality of openings, each opening corresponding to one contact pad of the plurality of contact pads and being substantially perpendicular to the corresponding contact pad when the first preformed non-conductive conformal sheet is placed over the circuit board and the at least one component; and
a second preformed conformal sheet placed over the first preformed conformal sheet, the second preformed conformal sheet constructed from a conductive material and at least partially grounded to the circuit board.

2. The electronic device of claim 1, wherein:
the second preformed conformal sheet is electrically connected to the plurality of contact pads.

3. The electronic device of claim 2, wherein:
the second preformed conductive sheet is electrically connected to the plurality of contact pads through the each corresponding opening of the plurality of openings of the first preformed non-conductive conformal sheet.

4. The electronic device of claim 2, wherein the second preformed conformal sheet is electrically connected to the each conductive pad of the plurality of contact pads by at least one of:
soldering;
surface mount technology;
a conductive adhesive; and
a mechanical connector.

5. The electronic device of claim 1, wherein:
the at least one component comprises a plurality of sides; and
the second preformed conformal sheet is partially grounded to the circuit board along at least two of the plurality of sides.

6. The electronic device of claim 5, wherein:
the second preformed conformal sheet is grounded to the circuit board along each of the plurality of sides of the component.

7. The electronic device of claim 1, wherein:
the first preformed non-conductive conformal sheet covers the entirety of the at least one component.

8. The electronic device of claim 1, wherein:
the plurality of contact pads comprise a substantially rectangular shape; and
the plurality of openings comprise a substantially rectangular shape, such that the intersection of the contact pads and the openings substantially forms a criss-cross pattern.

9. A method for shielding an electronic device component from electromagnetic interference, comprising:
coupling the electronic device component to a circuit board;
forming a non-conductive conformal sheet comprising:
at least one opening; and
at least one intermediate coating;
applying the formed non-conductive conformal sheet over the electronic device component such that the at least one opening and the at least one intermediate coating are placed over at least one contact pad of the circuit board;
forming a conductive conformal sheet;
removing the at least one intermediate coating after applying the formed non-conductive sheet; and
applying the formed conductive conformal sheet over the formed non-conductive conformal sheet, component, and circuit board, wherein at least one portion of the formed conductive conformal sheet is grounded to the circuit board.

10. The method of claim 9, wherein:
the at least one portion of the formed conductive conformal sheet is grounded to a region adjacent to an interface between the component and the circuit board.

11. The method of claim 9, further comprising:
electrically connecting the formed conductive conformal sheet to the at least one conductive pad via the at least one opening.

12. An electromagnetic interference shield, comprising:
a first preformed sheet of non-conductive material comprising:
at least one opening; and
a first fiducial, the first preformed sheet being coupled to a top surface of an electronic device component, the electronic device component comprising a second fiducial that is operably aligned with the first fiducial;
a second preformed sheet of conductive material coupled to the first preformed sheet; and a connection interface for electrically connecting the second sheet to a contact pad of a circuit board via the at least one opening of the first preformed sheet.

13. The electromagnetic interference shield of claim 12, wherein at least one of the first sheet and the second sheet is applied using at least one of:
an adhesive; and
a heat process.

14. The electromagnetic interference shield of claim 12, wherein the connection interface comprises at least one of:
solder;
surface mount technology;
a conductive adhesive; and
a mechanical fastener.

15. The electronic device of claim 1, wherein:
the first preformed non-conductive conformal sheet is coupled to the at least one component via at least one of an adhesive and heat shrinking.

16. The electronic device of claim 1, wherein:
a top surface of the at least one component comprises a first fiducial; and
the first preformed non-conductive conformal sheet comprises a second fiducial, the first and second fiducials being aligned when the first preformed non-conductive conformal sheet is placed over the at least one component.

17. The electronic device of claim 16, wherein:
the second preformed conformal sheet comprises a third fiducial, the first, second, and third fiducials being aligned when the second preformed conformal sheet is placed over the first preformed non-conductive conformal sheet.

18. The method of claim 11, wherein the at least one opening comprises a plurality of openings and the at least one contact pad comprises a plurality of contact pads.

19. The method of claim 18, wherein each opening of the plurality of openings is substantially perpendicular to a corresponding contact pad of the plurality of contact pads.

20. The method of claim 9, wherein the intermediate coating comprises at least one of Teflon and polyethylene.

21. The method of claim 9, wherein removing the at least one intermediate coating is performed via at least one of lasers and etching.

22. The electromagnetic interference shield of claim 12, wherein:
the second sheet comprising a third fiducial, the first, second, and third fiducials being operably aligned when the second sheet is coupled to the first sheet.

* * * * *